United States Patent [19]

Auld

[11] 4,021,657

[45] May 3, 1977

[54] SURFACE ELASTIC WAVE MEMORY CORRELATOR

[75] Inventor: Bert A. Auld, Paris, France

[73] Assignee: Thomson-CSF, Paris, France

[22] Filed: May 7, 1976

[21] Appl. No.: 684,384

[30] Foreign Application Priority Data

May 13, 1975 France ............................ 75.14877

[52] U.S. Cl. ................................ 235/181; 310/9.8; 333/30 R; 333/72

[51] Int. Cl.² ...................... G06G 7/19; H03H 9/02

[58] Field of Search ........... 235/181; 333/30 R, 72; 310/8.1, 9.8

[56] References Cited

UNITED STATES PATENTS

| | | | |
|---|---|---|---|
| 3,903,406 | 9/1975 | London | 235/181 |
| 3,925,653 | 12/1975 | Otto | 235/181 |
| 3,982,113 | 9/1976 | Coldren | 235/181 |

*Primary Examiner*—Felix D. Gruber

*Attorney, Agent, or Firm*—Cushman, Darby & Cushman

[57] ABSTRACT

The present invention relates to surface elastic wave memory correlators, which make it possible to form the correlation product of two successive signals. It consists in sampling the first of said signals at the surface of a surface elastic wave delay line, in storing the samples in capacitors and in forming the product of said samples with said second signal, by varying the impedance of the circuits through which said second signal passes, as a function of the value of the stored samples. The products obtained are added in order to give the correlation signal.

7 Claims, 1 Drawing Figure

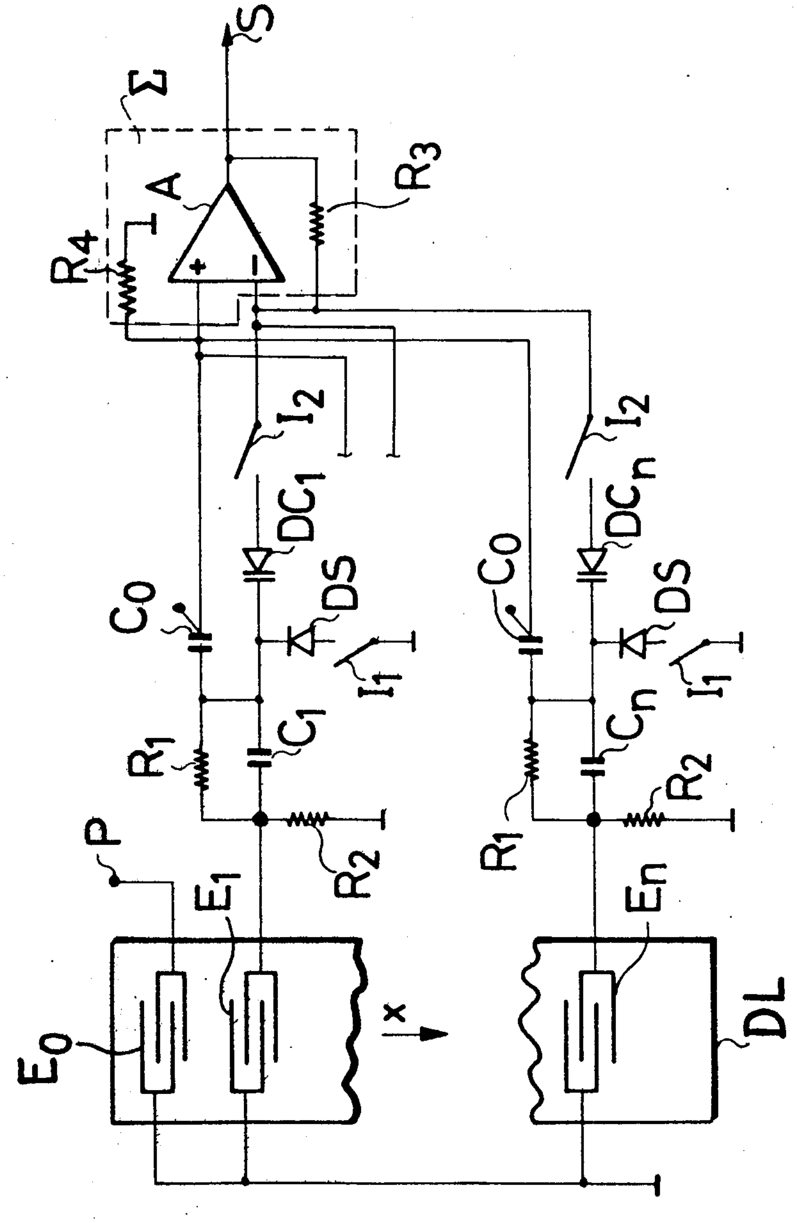
S
Σ
A
R4
R3
I2
I2
DC1
DCn
C0
C0
DS
DS
I1
I1
C1
Cn
R1
R1
R2
R2
P
E1
En
E0
x
DL

SURFACE ELASTIC WAVE MEMORY CORRELATOR

The present invention relates to surface elastic wave memory correlator devices, in which the correlation product of two signals introduced successively into said correlator is formed.

It is well known to utilise a surface elastic wave delay line in order to form a correlator. To do this, it is possible for example to excite the two ends of such a line with two carrier waves of different frequencies, $f_1$ and $f_2$, modulated by the signals which are to be correlated, and to pick off the counter-propagating waves propagating along the line, using a series of elementary transducers distributed along the line. Each of these transducers is connected to an electrical circuit comprising a diode biased in the forward direction. The mixing of the two signals picked off by each elementary transducer gives rise to cross-modulation products, due to the presence of the diode. The sum of the signals coming from the different circuits is then formed, and from this sum there is extracted the signal corresponding to a given cross-modulation order, for example $f_1 + f_2$. This latter signal is a carrier wave whose modulation envelope, with suitable time scales, represents the desired correlation product.

In order, in particular, to be able to adopt time scales which are easy to implement, attempts have been made to store the first of these signals in order to be able to excite the line using the same transducer, the signals then propagating in the same direction at the surface of the line. To do this, it is possible for example to arrange a semi-conductor wafer at a small interval from the delay line. By applying a voltage pulse to said wafer when the first signal is fully distributed over the surface of the delay line, the electric field due to the first signal gives rise to the capture of a certain number of electrons by the surface traps in the semi-conductor. The thus trapped electrons result in the production of an electric field similar to that which has served to capture them and which disappears as these electrons escape from the traps. This process makes it possible to store the first signal for a certain period of time but this time is short and the sensitivity of the device obtained is low.

In accordance with the present invention there is provided a device for correlating a first signal $V_1(t)$ with a second signal $V_2(t)$, which comprises:

a surface elastic wave delay line;

exciting means for exciting said delay line with successively a first and a second modulated carriers $V_1(t)$ cos.$\omega t$ and $V_2(t) \cos \omega t$, producing a first and a second elastic waves propagating and extending along an axis on the surface of said delay line;

a set of read-out transducers uniformly distributed along said axis; said transducers being excited by said modulated carriers with the same phase;

sampling and storing means connected to said transducers for uniformly sampling said first surface elastic wave when it is wholly extended along said delay-line, storing a set of samples $V_{1k}$;

variable impedance elements connected to said sampling and storing means for receiving simultaneously said samples and a set of signals $V_{2k}(t) \cos \omega t$ produced on said transducers by said second elastic wave, delivering a set of product signals $V_{1k} V_{2k}(t) \cos \omega t$; and adder means for adding said product signals, delivering a third modulated carrier $V_3(t) \cos \omega t$; the modulation signal $V_3(t)$ of said third modulated carrier representing, with the exception of a fixed delay, the correlation product of said first and second signals.

For a better understanding of the invention, and to show how the same may be carried into effect, reference will be made to the ensuing description and to the attached FIGURE:

Single FIGURE illustrates schematically a correlator according to the invention.

The correlator shown in the FIG. comprises a surface elastic wave delay line DL equipped with transducers $E_o$ to $E_n$. The transducers $E_1$ to $E_n$ are connected to circuits each of which is constituted by two resistors $R_1$ and $R_2$, by one of the capacitors $C_1$ to $C_n$, by a diode DS, by one of the variable-capacitance diodes or varicaps, $DC_1$ to $DC_n$, by a variable capacitor $C_o$ and by two contactbreakers $I_1$ and $I_2$. The capacitors $C_o$ are connected to the + inputs of an adder circuit Σ and the contactbreakers $I_2$ to the − input of said same circuit Σ. The circuit is constituted by a differential amplifier A equipped with two resistors $R_3$ and $R_4$. We will use $V_1(t)$ and $V_2(t)$ to define the signals which are to be correlated, the correlation signal then being $V_3(t)$. These various signals will be represented by the modulation of a carrier whose frequency $\omega/2\pi$ may for example be some few tens of MHz. We will utilise a modulation method such that said modulated carrier is represented by the signals $V_1(t) \cos \omega t$, $V_2(t) \cos \omega t$, and $V_3(t) \cos \omega t$.

During a first time period, the signal $V_1(t)$ cos. $\omega t$ is applied to the input P of the correlator. The exciting transducer $E_o$ excites the delay line DL and results in the advent of an elastic wave which propagates at the surface of the line in the direction X. When said wave reaches the end of the line, the signal $V_1(t) \cos \omega t$ is, at it were, recorded in the line. Since it is necessary to process the whole of this signal, its maximum duration is fixed by the length of the delay line. Conversely, in order to process a signal of given duration, it is necessary to have a delay line of a certain minimum length.

When said first signal is thus wholly present on the line, contactbreakers $I_1$ are briefly closed by means of a control circuit which has not been shown. These contactbreakers thus illustrated are, due to the speed of the phenomena involved, static devices such as field-effect transistors for example. The diodes DS which are thus put into operation, rectify the alternating voltages developed in the read-out transducers $E_1$ to $E_n$ by the elastic wave propagating at the surface of the delay line. Since the resistance of the load circuits thus closed is very low, the capacitors $C_1$ to $C_n$ charge during this brief instant to the peak values of the voltages furnished by the transducers.

These peak values represent the value of $V_1(t) \cos \omega t$ at the times $t$ defined by the positions of the transducers. Thus, in the capacitors $C_1$ to $C_n$, a series of samples of the envelope ($V_1(t)$ of the carrier is available. We will call these samples $V_{1k}$.

The capacitors cannot discharge except across the resistors $R_1$ which have a sufficiently high resistance to enable us to consider this discharge as being negligible in the ensuing process. The diodes $DC_1$ to $DC_n$ are reverse-biased by the voltages stored in the capacitors and do not conduct.

For the samples to correctly represent $V_1(t)$, they must be sufficient in number. If, therefore, $V_1(t)$ has a duration T and a maxima frequency F (frequency of the highest harmonic required for correct reproduction), the Shannon theorem gives us a value $n = 2FT$ for the minimum number of samples.

During a second time period, when the first elastic wave has passed fully through the line and when the latter has returned to the rest state, the signal $V_2(t)$ is applied at P and the contactbreakers $I_2$ are closed by means of a control circuit which has not been shown. These contactbreakers, so marked, by reason of the speed of the phenomena are static devices such as field-effect transistors for example. The transducer $E_o$ excites the delay line DL and results in the advent of an elastic wave which propagates at the surface of the line in the direction X. This wave, in the transducers $E_1$ to $E_n$, develops alternating voltages which we will call $V_{2k}(t) \cos \omega t$. It is necessary indeed in order to carry out the adding operation which will be described later on, for the transducers to be positioned in such a fashion that the signals picked off are in phase but this presents no particular difficulty and corresponds with the factor $\cos \omega t$, said factor having a constant phase for the signals. These voltages pass through the capacitors $C_1$ to $C_n$ since the capacitance of these latter is made sufficiently high to give them a negligible impedance at the frequency $\omega/2\pi$. These voltages are therefore applied to the varicap diodes $DC_1$ to $DC_n$ and to the capacitors $C_o$.

The varicap diodes are furthermore subjected to the direct voltages representing the samples Vhd 1k stored in the capacitors $C_1$ to $C_n$. These voltages are applied via the resistors $R_2$ and the input impedance (very low) of the adder circuit Σ. The capacitance of a varicap diode may be represented, for small signals around a bias voltage of zero, by the linear function $C_k = C_o - \alpha V_{1k}$. It is precisely this value $C_o$ which will be taken as the capacitance of the capacitors $C_o$. These latter are variable in order to make it possible to precisely compensate the constant term $C_k$ but the calculations will be performed assuming all these terms to be identical, which comes down to the same thing.

The adder circuit Σ may be designed for example as a high-gain differential amplifier A with a negative feedback resistor $R_3$ and a compensating resistor $R_4$ of same value as $R_3$ between the input + and the ground. This kind of circuit has a very low input impedance and those skilled in the art will appreciate that its output voltage represents the algebraic sum (depending upon whether the + input or the − input is used) of the currents applied to its inputs, to within a proportionality coefficient depending upon $R_3$ and $R_4$.

These currents are purely alternating currents because the capacitors $C_o$ and the diodes $DC_1$ to $DC_n$ can be considered as pure capacitances. The input impedance of the adder is virtually zero so that the value of these currents is given by $V_{2k}(t) \cos \omega t \times j(C_o - \alpha V_{1k}) \omega$ and by $V_{2k}(t) \cos \omega t \times jC_o \omega$. By forming the algebraic difference of these currents, the term in $C_o$ disappears which points up the advantage of having variable capacitors $C_o$, and by combining all the numerical coefficients into a single one marked A, the output voltage $V_s(t)$ can be written as $$V_s(t) = A \sum_{k=1}^{K=n} V_{1k} V_{2k}(t) \cos \omega t.$$

To retain the linear character of the operations thus formed, it is a good idea to take for the level of the second signal $V_2(t) \cos \omega t$ a value substantially lower than that of the level of the first $V_1(t) \cos \omega t$, for example ten times less.

It is easy to obtain, by rectifying, the envelope of the modulated carrier $V_s(t)$, and it can be shown that this envelope is in fact the desired correlation product $V_3(t)$. In effect, let us measure the distances along the delay line in the direction X and from an origin located at $E_o$. The transducers $E_1$ and $E_n$ will be located at abscissa points $x_1$ to $x_n$. Let us name L the length of the delay line and $v$ the velocity of the surface elastic waves. Let us also fix the time scale zero of each signal at the instant at which it is applied to the input P of the correlator. Let us furthermore sample $V_1(t) \cos \omega t$ at the instant at which its commencement reaches that end of the line which is opposite to the transducer $E_o$. The value of the samples stored in the capacitors $C_1$ to $C_n$ will be given by $$V_{1k} = V_1\left(\frac{L}{v} - \frac{x_k}{v}\right).$$

Similarly, the value of the signal $V_{2k}(t) \cos. \omega t$ picked off by the transducers will be given by:

$$V_2k\ (t) \cos \omega t = V_2\left(t - \frac{x_k}{v}\right) \cos \omega t.$$

Thus:

$$V_s(t) = A \sum_{k=1}^{k=n} V_1\left(\frac{L}{v} - \frac{x_k}{v}\right) V_2\left(t - \frac{x_k}{v}\right) \cos \omega t.$$

It will be seen that the envelope $$V(t) = A \sum_{k=1}^{k=n} V_1\left(\frac{L}{v} - \frac{x_k}{v}\right) V_2\left(t - \frac{x_k}{v}\right)$$

is a series which gives an approximate value of the correlation integral of $V_1(t)$ and $V_2(t)$, with a delay equal to $L/v$ but in accordance with an uncompressed time scale. This series conforms with the correlation integral if the condition defined by the Shannon theorem and referred to earlier, is satisfied.

The invention is not limited to the embodiment shown in the attached FIGURE. In particular, the direction of connection of the diodes DS and $DC_1$ to $DC_n$ may be reversed (their common point is then the anode) so that the voltages stored in the capacitors $C_1$ to $C_n$ are negative, the diodes $DC_1$ to $DC_n$ then always being reversed-biased.

What I claim is:

1. A device for correlating a first signal $V_1(t)$ with a second signal $V_2(t)$, which comprises:
   - a surface elastic wave delay line;
   - exciting means for exciting said delay line with successively a first and a second modulated carriers $V_1(t) \cos. \omega t$ and $V_2(t) \cos \omega t$, producing a first and a second elastic waves propagating and extending along an axis on the surface of said delay line;

a set of read-out transducers uniformly distributed along said axis; said transducers being excited by said modulated carriers with the same phase;

sampling and storing means connected to said transducers for uniformly sampling said first surface elastic wave when it is wholly extended along said delay-line, storing a set of samples $V_{1k}$;

variable impedance elements connected to said sampling and storing means for receiving simultaneously said samples and a set of signals $V_{2k}(t) \cos \omega t$ produced on said transducers by said elastic wave, delivering a set of product signals $V_{1k}$, $V_{2k}(t) \cos \omega t$; and adder means for combining said product signals, delivering a third modulated carrier $V_3(t) \cos \omega t$; the modulation signal $V_3(t)$ of said third modulated carrier representing, with the exception of a fixed delay, the correlation product of said first and second signals.

2. A device as claimed in claim 1, said variable impedance elements further delivering a set of parasitic signals $C_o V_{2k}(t) \cos \omega t$, said device further comprising correcting elements connected to said sampling and storing means for delivering to said adder means a set of correction signals suppressing said parasitic product signals.

3. A device as claimed in claim 2, wherein said sampling and storing means comprises:

diodes for rectifying read-out signals produced on said transducers by said first elastic wave, delivering said samples $V_{1k}$;

means for switching on during a short time said diodes when said first elastic wave is wholly extended along said delay-line; and capacitors for storing said samples.

4. A device as claimed in claim 3, wherein said variable impedance elements are variable-capacitance diodes biased in such a fashion that their capacitance is a substantially linear function of the value of said samples $V_{1k}$.

5. A device as claimed in claim 4, wherein said variable capacitance diodes are reverse-biased by said samples $V_{1k}$.

6. A device as claimed in claim 5, wherein, the variation law of the capacitance of said variable capacitance diodes being substantially represented around a working point by the formula $C_o - \alpha V_{1k}$, said correcting elements are capacitors of value $C_o$ connected to an input of said adder means inverted in respect to said sampling and storing means.

7. A device as claimed in claim 6, wherein said adder means comprises an operational amplifier with a positive and a negative input, said sampling and storing means being connected to said negative input and said correcting means being connected to said positive input.

* * * * *